United States Patent
An et al.

(10) Patent No.: US 12,255,639 B2
(45) Date of Patent: Mar. 18, 2025

(54) FET CONTROLLING APPARATUS AND METHOD

(71) Applicant: LG ENERGY SOLUTION, LTD., Seoul (KR)

(72) Inventors: Yang-Soo An, Daejeon (KR); Sang-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 586 days.

(21) Appl. No.: 17/438,604

(22) PCT Filed: Nov. 26, 2020

(86) PCT No.: PCT/KR2020/017002
§ 371 (c)(1),
(2) Date: Sep. 13, 2021

(87) PCT Pub. No.: WO2021/107653
PCT Pub. Date: Jun. 3, 2021

(65) Prior Publication Data
US 2022/0149836 A1    May 12, 2022

(30) Foreign Application Priority Data
Nov. 26, 2019   (KR) .................. 10-2019-0153701

(51) Int. Cl.
*H03K 17/687*    (2006.01)
*H02J 7/00*    (2006.01)

(52) U.S. Cl.
CPC ............ *H03K 17/687* (2013.01); *H02J 7/007* (2013.01)

(58) Field of Classification Search
CPC ......... H03K 17/687; H03K 2017/6875; H03K 17/6877; H03K 2217/0027; H02J 7/007
See application file for complete search history.

(56) References Cited

U.S. PATENT DOCUMENTS

| 4,430,586 A | 2/1984 | Hebenstreit |
| 6,559,689 B1 * | 5/2003 | Clark ................... H03K 17/063 327/91 |

(Continued)

FOREIGN PATENT DOCUMENTS

| CN | 101563720 A | 10/2009 |
| EP | 0 039 952 A1 | 11/1981 |

(Continued)

OTHER PUBLICATIONS

International Search Report (PCT/ISA/210) issued in PCT/KR2020/017002, dated Mar. 22, 2021.

(Continued)

*Primary Examiner* — Julian D Huffman
*Assistant Examiner* — Sadia Kousar
(74) *Attorney, Agent, or Firm* — Birch, Stewart, Kolasch & Birch, LLP

(57) ABSTRACT

The present disclosure relates to a field-effect transistor (FET) controlling apparatus and method for accurately, controlling an operation state of a FET by adaptively adjusting a voltage applied to the FET to correspond to a voltage of a source terminal of the FET. The voltage applied to the gate terminal of the FET may be adaptively controlled according to the voltage of the source terminal using a capacitor. Therefore, even when the source terminal is not connected to the ground but connected to an external load, there is an advantage that the operation state of the FET may be smoothly and accurately controlled. In addition, there is an advantage that a voltage within a certain range may be applied to the gate terminal of the FET.

10 Claims, 7 Drawing Sheets

(56) References Cited

U.S. PATENT DOCUMENTS

| | | |
|---|---|---|
| 2008/0036710 A1 | 2/2008 | Kim |
| 2010/0001983 A1 | 1/2010 | Abe |
| 2010/0045650 A1 | 2/2010 | Fish et al. |
| 2010/0214004 A1 | 8/2010 | Hosoda et al. |
| 2012/0075890 A1 | 3/2012 | Ozawa |
| 2012/0161817 A1 | 6/2012 | Kanayama |
| 2015/0381167 A1 | 12/2015 | Sicard et al. |
| 2016/0241051 A1 | 8/2016 | Yang |
| 2016/0315487 A1 | 10/2016 | Shim |
| 2019/0199103 A1 | 6/2019 | Kawano et al. |
| 2019/0229717 A1 | 7/2019 | Tajima |
| 2019/0393825 A1 * | 12/2019 | Maeshima ............ H02P 29/024 |

FOREIGN PATENT DOCUMENTS

| | | | |
|---|---|---|---|
| JP | 2-21931 | U | 2/1990 |
| JP | 2-158212 | A | 6/1990 |
| JP | 9-289734 | A | 11/1997 |
| JP | 11-103525 | A | 4/1999 |
| JP | 2003-79058 | A | 3/2003 |
| JP | 2005-318303 | A | 11/2005 |
| JP | 2008-206258 | A | 9/2008 |
| JP | 2012-138832 | A | 7/2012 |
| JP | 2015-53785 | A | 3/2015 |
| JP | 2015-107039 | A | 6/2015 |
| JP | 2019-115166 | A | 7/2019 |
| JP | 2019-129614 | A | 8/2019 |
| KR | 10-1997-0031302 | A | 6/1997 |
| KR | 20-0201152 | Y1 | 11/2000 |
| KR | 10-0739334 | B1 | 7/2007 |
| KR | 10-2012-0054295 | A | 5/2012 |
| KR | 10-2016-0100675 | A | 8/2016 |
| KR | 10-2016-0125852 | A | 11/2016 |

OTHER PUBLICATIONS

Extended European Search Report for European Application No. 20892164.3 issued on Jul. 27, 2022.

* cited by examiner

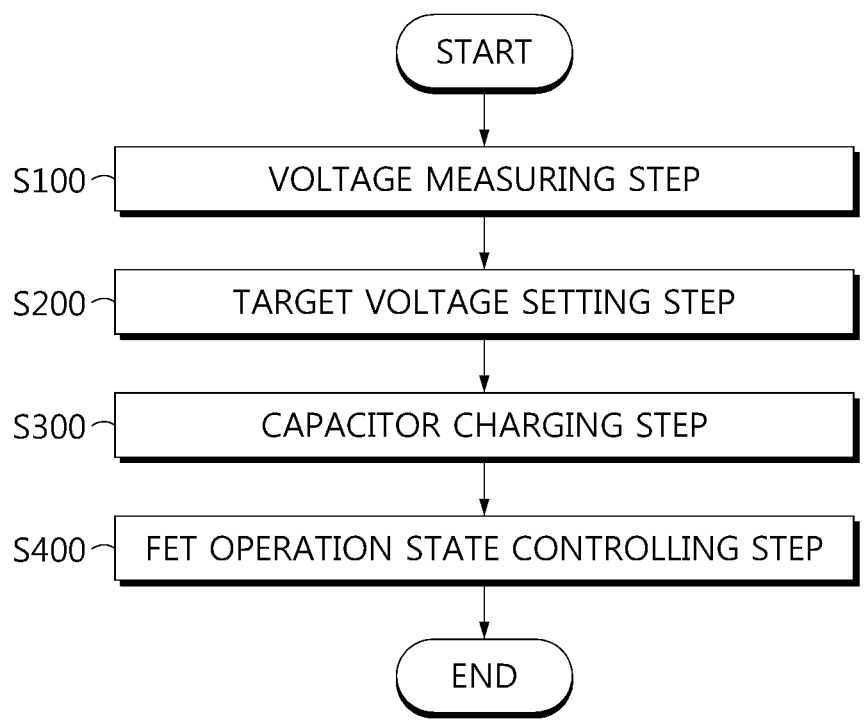

FET CONTROLLING APPARATUS AND METHOD

TECHNICAL FIELD

The present application claims priority to Korean Patent Application No. 10-2019-0153701 filed on Nov. 26, 2019 in the Republic of Korea, the disclosures of which are incorporated herein by reference.

The present disclosure relates to a field-effect transistor (FET) controlling apparatus and method, and more particularly, to a FET controlling apparatus and method for accurately controlling an operation state of a FET.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, if such a battery is provided to a battery pack, a main relay through which a current output from the battery or a current flowing into the battery flows may be disposed on a main charging/discharging path of the battery pack.

For example, if an N-channel MOSFET including a drain terminal, a source terminal and a gate terminal is applied to the main relay, the drain terminal and the source terminal may be electrically connected only when a voltage difference between the source terminal and the gate terminal is equal to or greater than a certain level. In this case, if the source terminal and the gate terminal are connected to a common ground, the operation state of the FET may be controlled by adjusting the voltage applied to the gate terminal. However, if the source terminal and the gate terminal are not connected to a common ground, there is a problem in that the operation state of the FET cannot be controlled without considering the voltage applied to the source terminal. That is, in order to accurately control the operation state of the FET, it is necessary to adaptively adjust the voltage applied to the gate terminal to correspond to the voltage applied to the source terminal.

DISCLOSURE

Technical Problem

The present disclosure is designed to solve the problems of the related art, and therefore the present disclosure is directed to providing a FET controlling apparatus and method for accurately controlling an operation state of a FET by adaptively adjusting a voltage applied to the FET to correspond to a voltage of a source terminal of the FET.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a field-effect transistor (FET) controlling apparatus for controlling an operation state of a FET that includes a drain terminal, a gate terminal and a source terminal, the FET controlling apparatus comprising: a capacitor configured to be connected in parallel with the FET between the gate terminal and the source terminal through a discharging line; a voltage source configured to be electrically connected to the capacitor through a charging line and configured to charge the capacitor in response to the charging line being electrically connected; a measurer configured to measure a voltage of the source terminal and a voltage of the capacitor; and a controller configured to receive the voltage of the source terminal and the voltage of the capacitor from the measurer, set a target voltage based on the voltage of the source terminal, charge the capacitor by the voltage source, by electrically connecting the charging line, until the voltage of the capacitor becomes equal to or higher than the target voltage, and control an operation state of the FET by electrically connecting the discharging line after the capacitor is completely charged.

The controller may be configured to set the target voltage by adding a preset threshold voltage and the voltage of the source terminal.

The threshold voltage may be set in advance as a voltage difference between the gate terminal and the source terminal, which converts the operation state of the FET to a turn-on state.

The discharging line may be configured to include a first unit line having a first switch configured to connect the gate terminal and a first end of the capacitor; and a second unit line having a second switch configured to connect the source terminal and a second end of the capacitor.

The charging line may include a third unit line having a third switch configured to connect the first end of the capacitor and a positive electrode terminal of the voltage source; and a fourth unit line having a fourth switch configured to connect the second end of the capacitor and a negative electrode terminal of the voltage source.

The first end of the capacitor may be configured to be connected between the first switch and the third switch.

The second end of the capacitor may be configured to be connected between the second switch and the fourth switch.

The controller may be configured to control operation states of the first switch and the second switch simultaneously and to control operation states of the third switch and the fourth switch simultaneously.

The controller may be configured to electrically connect any one of the charging line and the discharging line and electrically disconnect the other thereof at every predetermined control cycle, after the capacitor is completely charged.

The predetermined control cycle may be a cycle set to maintain the voltage of the capacitor to be equal to or higher than the target voltage.

In response to the voltage of the source terminal being changed, the controller may be configured to reset the target voltage to correspond to the changed voltage of the source terminal and change the predetermined control cycle based on the reset target voltage.

The measurer may be configured to further measure a voltage of the drain terminal.

The controller may be configured to receive the voltage of the drain terminal from the measurer and diagnose whether the FET has a failure by comparing the voltage of the drain terminal and the voltage of the source terminal based on the operation state of the FET.

In another aspect of the present disclosure, there is also provided a battery pack, comprising the FET controlling apparatus according to an aspect of the present disclosure.

In still another aspect of the present disclosure, there is also provided a field-effect transistor (FET) controlling method for controlling an operation state of a FET that includes a drain terminal, a gate terminal and a source terminal, the FET controlling method comprising: a voltage measuring step of measuring a voltage of the source terminal and a voltage of a capacitor connected in parallel with the FET; a target voltage setting step of setting a target voltage based on the voltage of the source terminal measured in the voltage measuring step; a capacitor charging step of charging the capacitor so that the voltage of the capacitor becomes equal to or higher than the target voltage; and a FET operation state controlling step of controlling an operation state of the FET by using the capacitor that is completely charged in the capacitor charging step.

Advantageous Effects

According to an aspect of the present disclosure, the voltage applied to the gate terminal may be adaptively controlled according to the voltage of the source terminal using a capacitor. Therefore, even when the source terminal is not connected to the ground but connected to an external load, there is an advantage that the operation state of the FET may be smoothly and accurately controlled.

In addition, according to an aspect of the present disclosure, there is an advantage that a voltage within a certain range may be applied to the gate terminal of the FET.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 7 is a diagram schematically showing a FET controlling apparatus according to another embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
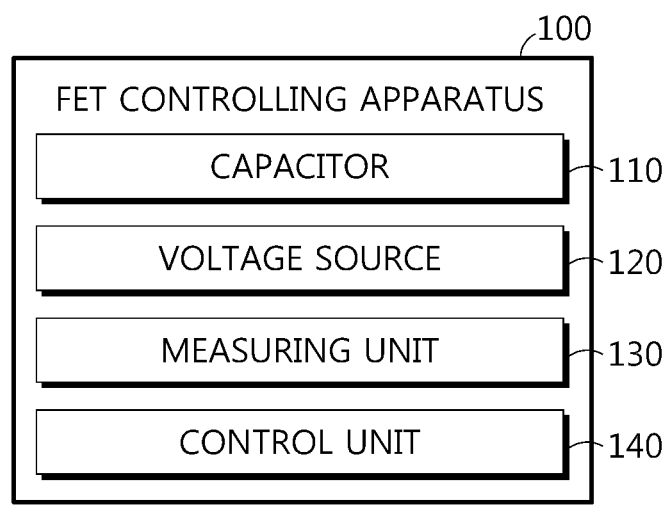
FIG. 1 is a diagram schematically showing a FET controlling apparatus according to an embodiment of the present disclosure.
Figure 2:
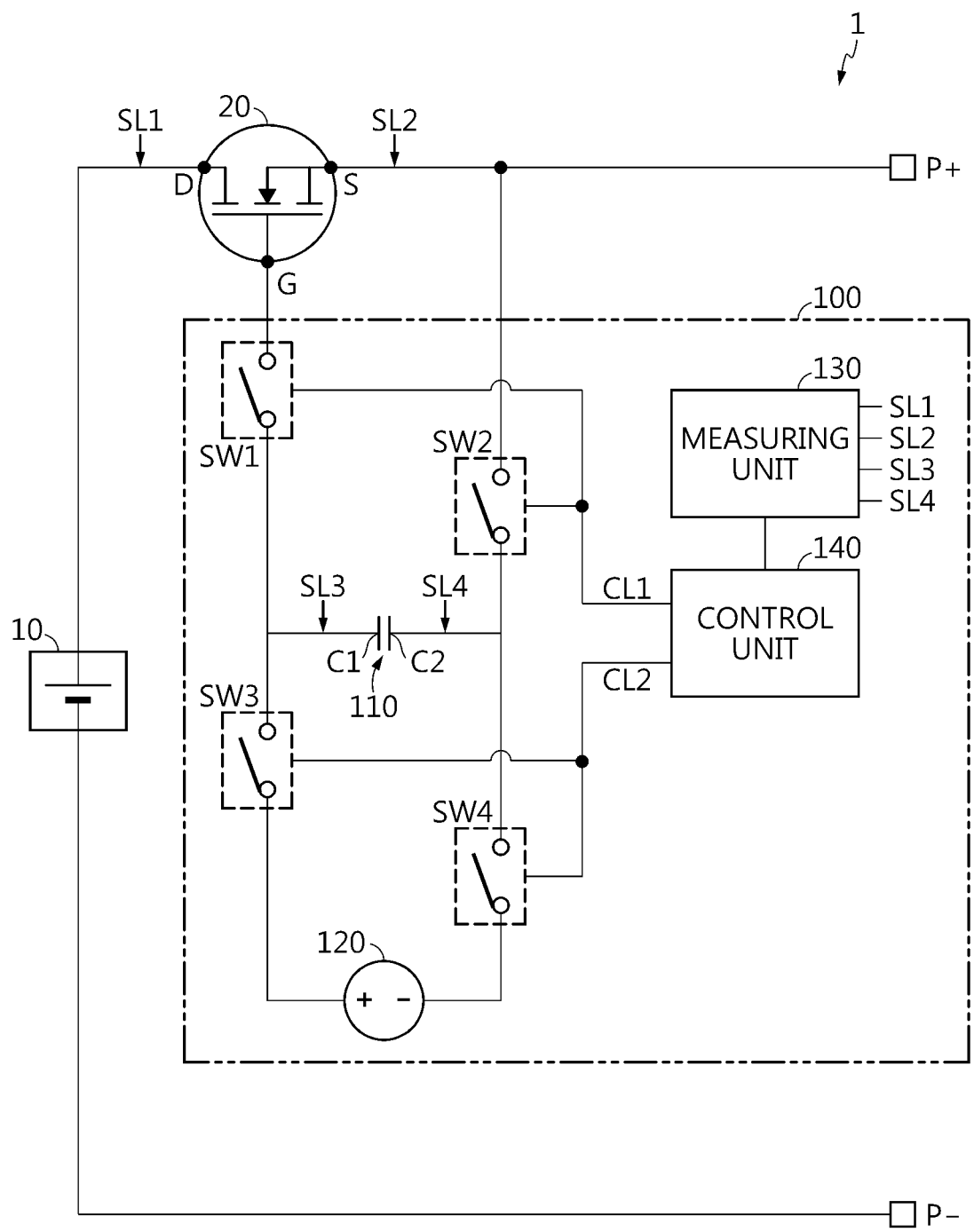
FIG. 2 is a diagram exemplarily showing a configuration of a battery pack that includes the FET controlling apparatus according to an embodiment of the present disclosure.

FIG. 1 is a diagram schematically showing a FET controlling apparatus 100 according to an embodiment of the present disclosure. FIG. 2 is a diagram exemplarily showing a configuration of a battery pack 1 that includes the FET controlling apparatus 100 according to an embodiment of the present disclosure.

Here, the FET 20 is a field effect transistor, and referring to FIG. 2, the FET 20 may include a drain terminal D, a gate terminal G, and a source terminal S.

Preferably, the FET 20 may employ a metal-oxide-semiconductor field effect transistor (MOSFET). Preferably, the FET 20 may employ an N-channel MOSFET. Hereinafter, it is assumed that the FET 20 is an N-channel MOSFET.

Referring to FIG. 1, the FET controlling apparatus 100 according to an embodiment of the present disclosure may include a capacitor 110, a voltage source 120, a measuring unit 130, and a control unit 140.

The capacitor 110 may be configured to be connected in parallel with the FET 20 between the gate terminal G and the source terminal S through a discharging line. Here, the discharging line refers to a line that connects one end C1 of the capacitor 110 and the gate terminal G of the FET 20, and a line that connects the other end C2 of the capacitor 110 and the source terminal S of the FET 20. That is, the discharging line indicates a line through which a current stored in the capacitor 110 is output toward the FET 20 when the capacitor 110 is discharged.

Referring to FIG. 2, the battery pack 1 may include a battery cell 10, a FET 20, and a FET controlling apparatus 100. The FET 20 may be connected in series between a positive electrode terminal P+ of the battery pack 1 and a positive electrode terminal of the battery cell 10.

Specifically, the drain terminal D of the FET 20 may be directly connected to the positive electrode terminal of the battery cell 10, and the source terminal S of the FET 20 may be directly connected to the positive electrode terminal P+ of the battery pack 1. In addition, one end C1 of the capacitor 110 may be connected to the gate terminal G of the FET 20, and the other end C2 of the capacitor 110 may be connected to the source terminal S of the FET 20. That is, as shown in FIG. 2, the capacitor 110 may be electrically connected in parallel with the FET 20 between the gate terminal G and the source terminal S of the FET 20. Therefore, the capacitor 110 and the gate terminal G and the source terminal S of the FET 20 may form a closed circuit.

Meanwhile, in the battery pack 1 shown in FIG. 2, the battery cell 10 refers to one independent cell that includes a negative electrode terminal and a positive electrode terminal and may be physically separated. For example, one pouch-type lithium polymer cell may be regarded as the battery cell 10. In addition, unlike FIG. 2, the battery pack 1 may include one or more battery cells 10 connected in series and/or in parallel. That is, the battery pack 1 may include a battery module having at least one battery cell 10.

The voltage source 120 may be configured to be electrically connected to the capacitor 110 through a charging line. Here, the charging line refers to a line that connects one end C1 of the capacitor 110 to the positive electrode terminal of the voltage source 120 and a line that connects the other end C2 of the capacitor 110 to the negative electrode terminal of the voltage source 120. That is, the charging line refers to a line that receives a current from the voltage source 120 when the capacitor 110 is charged.

For example, the voltage source 120 is a voltage source capable of outputting a 12 [V] DC current, and may be a voltage source independent from the battery cell 10 included in the battery pack 1.

Referring to FIG. 2, the positive electrode terminal of the voltage source 120 may be connected to one end C1 of the capacitor 110, and the negative electrode terminal of the voltage source 120 may be connected to the other end C2 of the capacitor 110. The capacitor 110 and the voltage source 120 may form a closed circuit.

In addition, the voltage source 120 may be configured to charge the capacitor 110 when the charging line is electrically connected.

For example, in the embodiment of FIG. 2, if the operation states of a third switch SW3 and a fourth switch SW4 are controlled to a turn-on state, the capacitor 110 may be charged by the voltage source 120. Specifically, if the operation states of the third switch SW3 and the fourth switch SW4 are controlled to a turn-on state, the current output from the voltage source 120 may flow through a closed circuit formed by the third switch SW3, the capacitor 110, the fourth switch SW4 and the voltage source 120. Therefore, if the charging line is electrically connected, the capacitor 110 may be charged.

The measuring unit 130 may be configured to measure a voltage (Vs) of the source terminal S and a voltage of the capacitor 110.

For example, referring to FIG. 2, the measuring unit 130 may be connected to a second sensing line SL2, a third sensing line SL3 and a fourth sensing line SL4. The measuring unit 130 may measure the voltage (Vs) of the source terminal S of the FET 20 through the second sensing line SL2. In addition, the measuring unit 130 may measure the voltage of the capacitor 110 through the third sensing line SL3 and the fourth sensing line SL4. At this time, the measuring unit 130 may measure the voltage of one end C1 of the capacitor 110 through the third sensing line SL3, and measure the voltage of the other end C2 of the capacitor 110 through the fourth sensing line SL4. In addition, the measuring unit 130 may measure the voltage of the capacitor 110 by calculating a difference between the measured voltages at both ends of the capacitor 110.

The control unit 140 may be configured to receive the voltage (Vs) of the source terminal S and the voltage of the capacitor 110 from the measuring unit 130.

The control unit 140 and the measuring unit 130 may be connected to each other to transmit and receive signals.

For example, referring to FIG. 2, the control unit 140 and the measuring unit 130 are connected to each other through a wired line, so that signals may be transmitted and received with each other.

As another example, unlike FIG. 2, the control unit 140 and the measuring unit 130 may be connected to each other by wireless communication, so that signals may be transmitted and received with each other.

The measuring unit 130 may convert the measured voltage (Vs) of the source terminal S and the voltage of the capacitor 110 into a digital signal. In addition, the measuring unit 130 may output the converted digital signal to a line connected to the control unit 140. The control unit 140 may receive the digital signal from the measuring unit 130 and obtain the voltage (Vs) of the source terminal S and the voltage of the capacitor 110 measured by the measuring unit 130 by reading the received digital signal.

The control unit 140 may be configured to set a target voltage (Vt) based on the voltage (Vs) of the source terminal S.

In the case of the FET 20, a current may flow from the drain terminal D to the source terminal S only when the voltage applied to the gate terminal G has a predetermined magnitude or above compared to the voltage applied to the source terminal S. That is, in the FET 20, a current may flow from the drain terminal D to the source terminal S only when a gate voltage (Vgs) is higher than a preset threshold voltage (Vth). Here, the gate voltage (Vgs) is a voltage value obtained by subtracting the voltage (Vs) of the source terminal S from the voltage (Vg) of the gate terminal G. In addition, here, the threshold voltage (Vth) is a voltage value set in advance such that the operation state of the FET 20 becomes a turn-on state. That is, the threshold voltage (Vth) may be set differently according to the specification of the FET 20. Considering such characteristics of the FET 20, the target voltage (Vt) may be a minimum demand voltage to be applied to the gate terminal G so that the drain terminal D and the source terminal S of the FET 20 are electrically connected.

The control unit 140 may set the target voltage (Vt) to be applied to the gate terminal G of the FET 20 based on the voltage (Vs) of the source terminal S received from the measuring unit 130.

For example, it is assumed that the threshold voltage (Vth) demanded for electrically connecting the drain terminal D and the source terminal S of the FET 20 is 3 [V] and the measured voltage (Vs) of the source terminal S is 1 [V]. If 3 [V] voltage is applied to the gate terminal G according to the preset threshold voltage (Vth) 3 [V], since the gate voltage (Vgs), which is a voltage difference between the voltage (Vg) of the gate terminal G and the voltage (Vs) of the source terminal S, is 2 [V], the operation state of the FET 20 may not be converted to a turn-on state. This is a case where the source terminal S is not connected to the ground, and for example, in the embodiment of FIG. 2, this may be a case where a load having a voltage of 1 [V] is connected to the battery pack 1. Therefore, the control unit 140 may set the target voltage (Vt) to be applied to the gate terminal G as 4 [V] by considering not only the case where the source terminal S is connected to the ground but also the case where another load is connected (e.g., the case where the voltage (Vs) of the source terminal S is not 0 [V]). That is, the control unit 140 may be configured to set the target voltage (Vt) by adding the preset threshold voltage (Vth) and the voltage (Vs) of the source terminal S.

The control unit 140 may be configured to charge the capacitor 110 by the voltage source 120 by electrically connecting the charging line until the voltage of the capacitor 110 becomes equal to or higher than the target voltage (Vt).

Referring to FIG. 2, the voltage source 120 may be electrically connected to the capacitor 110 through a charging line and may be configured to charge the capacitor 110 when the charging line is electrically connected. Therefore, the control unit 140 may electrically connect the charging line until the voltage of the capacitor 110 becomes equal to or higher than the set target voltage (Vt).

For example, as in the former embodiment, it is assumed that the threshold voltage (Vth) is 3 [V], the voltage (Vs) of the source terminal S is 1 [V], and the set target voltage (Vt) is 4 [V]. The control unit 140 may electrically connect the charging line so that the capacitor 110 is charged by the voltage source 120. In addition, the control unit 140 may continuously receive the voltage of the capacitor 110 from the measuring unit 130 to determine whether the voltage of the capacitor 110 becomes equal to or higher than 4 [V].

The control unit 140 may be configured to control the operation state of the FET 20 by electrically connecting the discharging line after the capacitor 110 is completely charged.

Preferably, the control unit 140 may electrically connect the discharging line after blocking the connection of the charging line. In this case, as the current stored in the capacitor 110 flows through the discharging line, the voltage of the capacitor 110 may be applied to the gate terminal G of the FET 20. Since the voltage of the capacitor 110 is equal to or higher than the target voltage (Vt), the gate voltage (Vgs) may be equal to or higher than the preset threshold voltage (Vth). Therefore, the operation state of the FET 20 is converted to a turn-on state, so that the current output from the battery cell 10 may flow from the drain terminal D to the source terminal S.

For example, in the embodiment of FIG. 2, it is assumed that a load is connected to the positive electrode terminal P+ and the negative electrode terminal P− of the battery pack 1. If the control unit 140 electrically connects the discharging line, the operation state of the FET 20 is converted to a turn-on state by the capacitor 110 charged equal to or higher than the target voltage (Vt), and the current output from the battery cell 10 may be applied to the load through the FET 20.

The FET controlling apparatus 100 according to an embodiment of the present disclosure may control the voltage applied to the gate terminal G according to the voltage (Vs) of the source terminal S by using the capacitor 110. That is, the FET controlling apparatus 100 may set the target voltage (Vt) to be applied to the gate terminal G in consideration of the voltage (Vs) of the source terminal S. Therefore, even if the source terminal S is not connected to the ground but connected to an external load, there is an advantage that the operation state of the FET 20 may be smoothly and accurately controlled.

Meanwhile, the control unit 140 included in the FET controlling apparatus 100 may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 140 may be implemented as a set of program modules. At this time, the program module may be stored in a memory and executed by the control unit 140. The memory may be provided in or out of the control unit 140, and may be connected to the control unit 140 by various well-known means.

Hereinafter, an exemplary configuration of the FET controlling apparatus 100 according to an embodiment of the present disclosure will be described in more detail.

The discharging line may be configured to include a first unit line having a first switch SW1 configured to connect the gate terminal G and one end C1 of the capacitor 110 and a second unit line having a second switch SW2 configured to connect the source terminal S and the other end C2 of the capacitor 110.

Specifically, the discharging line may be composed of the first unit line and the second unit line. The first switch SW1 for turning on or off the connection between the gate terminal G of the FET 20 and one end C1 of the capacitor 110 may be disposed on the first unit line. In addition, the second switch SW2 for turning on or off the connection between the source terminal S of the FET 20 and the other end C2 of the capacitor 110 may be disposed on the second unit line.

For example, in the embodiment of FIG. 2, the first unit line may be a line between the gate terminal G and one end C1 of the capacitor 110. The first switch SW1 connected in series with the gate terminal G and one end C1 of the capacitor 110 may be disposed on the first unit line. In addition, the second unit line may be a line between the source terminal S and the other end C2 of the capacitor 110. The second switch SW2 connected in series with the source terminal S and the other end C2 of the capacitor 110 may be disposed on the second unit line.

In addition, the operation states of the first switch SW1 and the second switch SW2 may be controlled by the control unit 140.

For example, in the embodiment of FIG. 2, the control unit 140 may be connected to the first switch SW1 and the second switch SW2 through the first control line CL1. In addition, the control unit 140 may control the operation states of the first switch SW1 and the second switch SW2 by outputting an operation state control signal to the first control line CL1. Here, the operation state control signal may include a turn-on control signal for converting the operation states of the first switch SW1 and the second switch SW2 to a turn-on state and a turn-off control signal for converting them to a turn-off state.

The charging line may be configured to include a third unit line having a third switch SW3 configured to connect one end C1 of the capacitor 110 and the positive electrode terminal of the voltage source 120 and a fourth unit line having a fourth switch SW4 configured to connect the other end C2 of the capacitor 110 and the negative electrode terminal of the voltage source 120.

Specifically, the charging line may be composed of the third unit line and the fourth unit line. The third switch SW3 for turning on or off the connection between one end of the voltage source 120 and one end C1 of the capacitor 110 may be disposed on the third unit line. In addition, the fourth switch SW4 for turning on or off the connection between the other end of the voltage source 120 and the other end C2 of the capacitor 110 may be disposed on the fourth unit line. Here, one end of the voltage source 120 may be a positive electrode terminal of the voltage source 120, and the other end of the voltage source 120 may be a negative electrode terminal of the voltage source 120.

For example, in the embodiment of FIG. 2, the third unit line may be a line between one end of the voltage source 120 and one end C1 of the capacitor 110. The third switch SW3 connected in series with one end of the voltage source 120 and one end C1 of the capacitor 110 may be disposed on the third unit line. In addition, the fourth unit line may be a line between the other end of the voltage source 120 and the other end C2 of the capacitor 110. The fourth switch SW4 connected in series with the other end of the voltage source 120 and the other end C2 of the capacitor 110 may be disposed on the fourth unit line.

In addition, the operation states of the third switch SW3 and the fourth switch SW4 may be controlled by the control unit 140.

For example, in the embodiment of FIG. 2, the control unit 140 may be connected to the third switch SW3 and the fourth switch SW4 through the second control line CL2. In addition, the control unit 140 may control the operation states of the third switch SW3 and the fourth switch SW4 by outputting an operation state control signal to the second control line CL2. Here, the operation state control signal may include a turn-on control signal for converting the operation states of the third switch SW3 and the fourth switch SW4 to a turn-on state and a turn-off control signal for converting them to a turn-off state.

Preferably, one end C1 of the capacitor 110 may be configured to be connected between the first switch SW1 and the third switch SW3. In addition, the other end C2 of the capacitor 110 may be configured to be connected between the second switch SW2 and the fourth switch SW4.

For example, if the operation states of the first switch SW1 and the second switch SW2 are a turn-on state and the operation states of the third switch SW3 and the fourth switch SW4 are a turn-off state, the capacitor 110 may be discharged. That is, the current stored in the capacitor 110 may be output toward the FET 20. More specifically, the current stored in the capacitor 110 may be output toward the gate terminal G of the FET 20.

As another example, if the operation states of the third switch SW3 and the fourth switch SW4 are a turn-on state and the operation states of the first switch SW1 and the second switch SW2 are a turn-off state, the capacitor 110 may be charged by the voltage source 120. That is, the current output from the voltage source 120 may be applied to the capacitor 110.

The control unit 140 may be configured to simultaneously control the operation states of the first switch SW1 and the second switch SW2 and simultaneously control the operation states of the third switch SW3 and the fourth switch SW4.

That is, the control unit 140 may block the connection between the discharging line and the capacitor 110 when electrically connecting the charging line, and may block the connection between the charging line and the capacitor 110 when electrically connecting the discharging line.

An example in which the control unit 140 controls the operation states of the first switch SW1, the second switch SW2, the third switch SW3 and the fourth switch SW4 will be described with reference to FIGS. 3 and 4.

Figure 3:
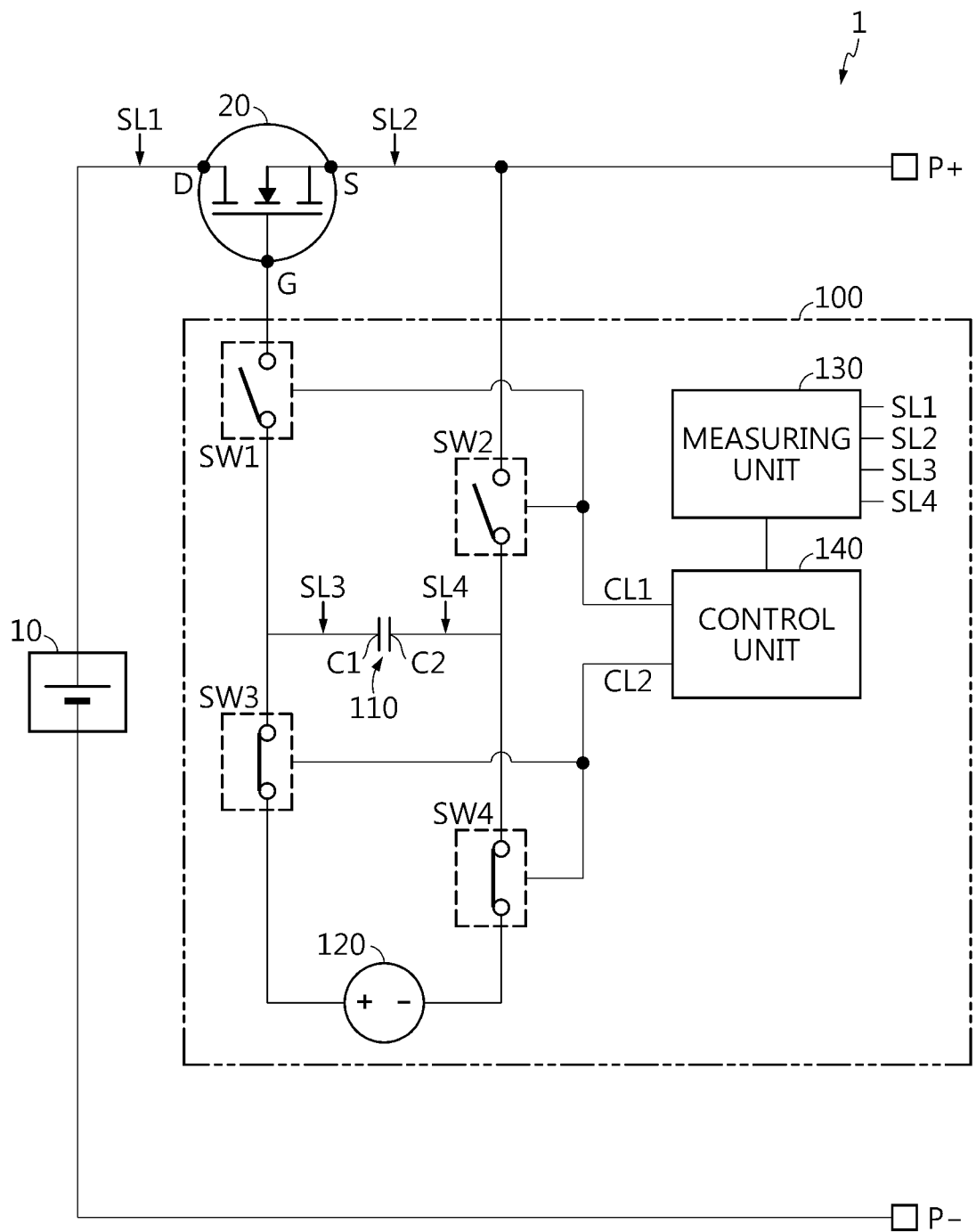
FIG. 3 is a diagram showing an exemplary configuration when a capacitor is charged in the battery pack that includes the FET controlling apparatus according to an embodiment of the present disclosure.

FIG. 3 is a diagram showing an exemplary configuration when a capacitor 110 is charged in the battery pack 1 that includes the FET controlling apparatus 100 according to an embodiment of the present disclosure. FIG. 4 is a diagram showing an exemplary configuration when the capacitor 110 is discharged in the battery pack 1 that includes the FET controlling apparatus 100 according to an embodiment of the present disclosure.

Referring to FIG. 3, when charging the capacitor 110, the control unit 140 may control the operation states of the third switch SW3 and the fourth switch SW4 to a turn-on state. Specifically, the control unit 140 may output a turn-on control signal to the second control line CL2 and output a turn-off control signal to the first control line CL1. In this case, the operation states of the first switch SW1 and the second switch SW2 may be a turn-off state, and the operation states of the third switch SW3 and the fourth switch SW4 may be a turn-on state. The voltage source 120, the third switch SW3, the capacitor 110 and the fourth switch SW4 form a closed circuit, so that the capacitor 110 may be charged by the voltage source 120.

Figure 4:
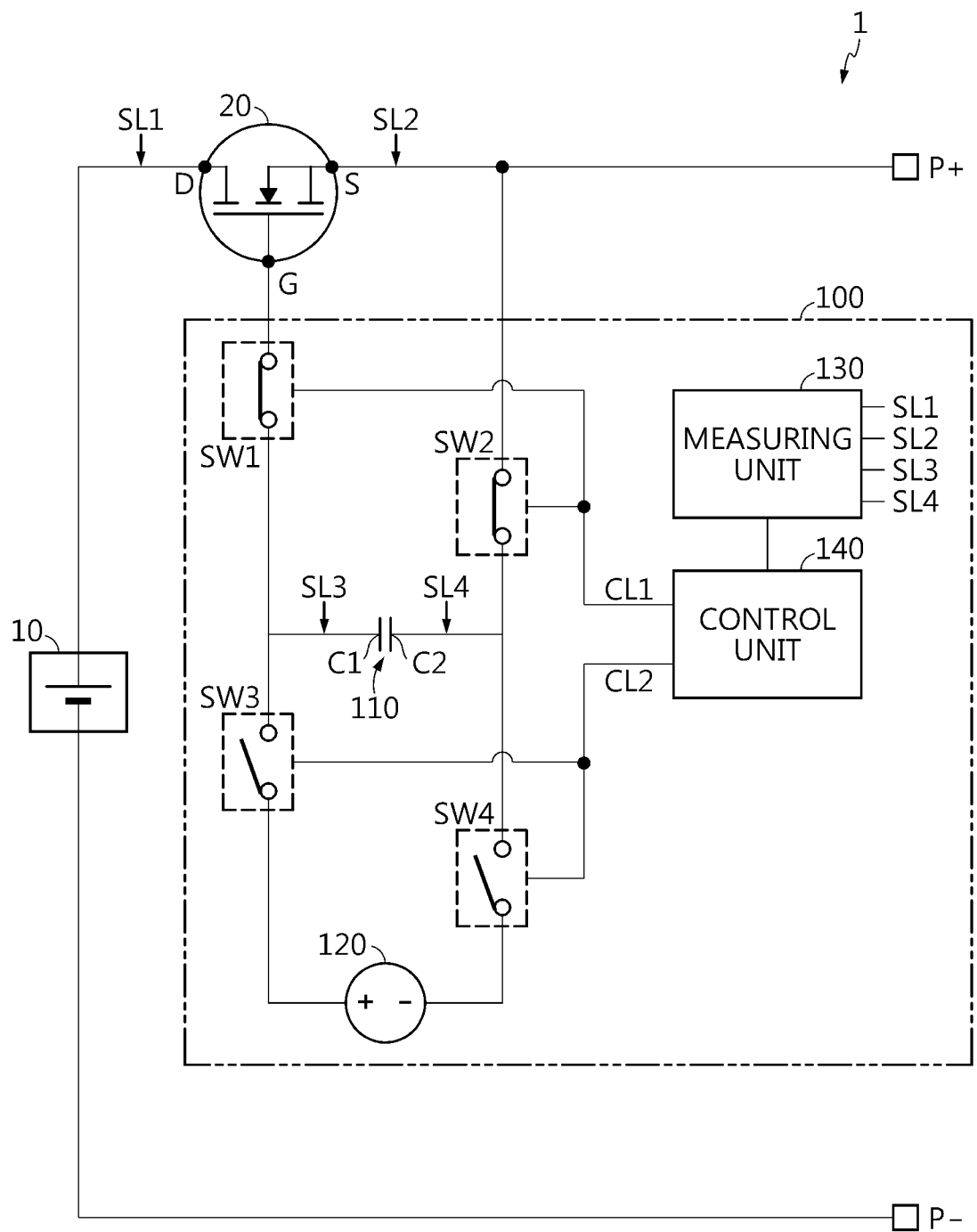
FIG. 4 is a diagram showing an exemplary configuration when the capacitor is discharged in the battery pack that includes the FET controlling apparatus according to an embodiment of the present disclosure.

Referring to FIG. 4, when discharging the capacitor 110 to switch the operation state of FET 20 to a turn-on state, the control unit 140 may control the operation states of the first switch SW1 and the second switch SW2 to a turn-on state. Specifically, the control unit 140 may output a turn-on control signal to the first control line CL1 and output a turn-off control signal to the second control line CL2. In this case, the operation states of the first switch SW1 and the second switch SW2 may be a turn-on state, and the operation states of the third switch SW3 and the fourth switch SW4 may be a turn-off state. The capacitor 110, the first switch SW1, the FET 20 and the second switch SW2 may form a closed circuit, so that the operation state of FET 20 is converted to a turn-on state.

That is, the FET controlling apparatus 100 according to an embodiment of the present disclosure may include a unit circuit for charging the capacitor 110 and a unit circuit for discharging the capacitor 110, respectively. In addition, the FET controlling apparatus 100 may charge the capacitor 110 until the voltage of the capacitor 110 becomes equal to or higher than the target voltage (Vt). Therefore, since the voltage of the capacitor 110 may be charged corresponding to the target voltage (Vt) based on the voltage (Vs) of the source terminal S, there is an advantage in that the operation state of the FET 20 may be adaptively controlled according to the voltage (Vs) of the source terminal S.

After the capacitor 110 is completely charged, the control unit 140 may be configured to electrically connect any one of the charging line and the discharging line and electrically disconnect the other thereof, at every predetermined control cycle.

For example, after the capacitor 110 is charged so that the voltage of the capacitor 110 is equal to or higher than the target voltage (Vt), if the charging line is electrically connected to maintain the operation state of the FET 20 in a turn-on state, the voltage of the capacitor 110 will gradually decrease. That is, since the current stored in the capacitor 110 is continuously output, the voltage of the capacitor 110 gradually decreases, so that the voltage of the capacitor 110 may become less than the target voltage (Vt). In this case, since the gate voltage (Vgs), which is a difference between the voltage (Vg) of the gate terminal G and the voltage (Vs) of the source terminal S of the FET 20, is lower than the preset threshold voltage (Vth), the operation state of the FET 20 may be converted to a turn-off state.

Therefore, the control unit 140 may maintain the voltage applied to the gate terminal G of the FET 20 within a certain range by alternately electrically connecting the charging line and the discharging line at every predetermined control cycle.

For example, if the control unit 140 controls the operation states of the first switch SW1 and the second switch SW2 to a turn-on state, the operation states of the third switch SW3 and the fourth switch SW4 may be controlled to a turn-off state. In addition, if the control unit 140 controls the operation states of the first switch SW1 and the second switch SW2 to a turn-off state, the operation states of the third switch SW3 and the fourth switch SW4 may be controlled to a turn-on state. That is, as shown in FIGS. 3 and 4, the operation states of the first switch SW1, the second switch SW2, the third switch SW3 and the fourth switch SW4 may be converted according to a predetermined control cycle.

Preferably, the predetermined control cycle may be set to any one of 0.3 ms (e.g., 3 kHz frequency) to 10 ms (e.g., 100 Hz frequency). More preferably, the predetermined control cycle may be set to 0.5 ms (e.g., 2 kHz frequency).

Figure 5:
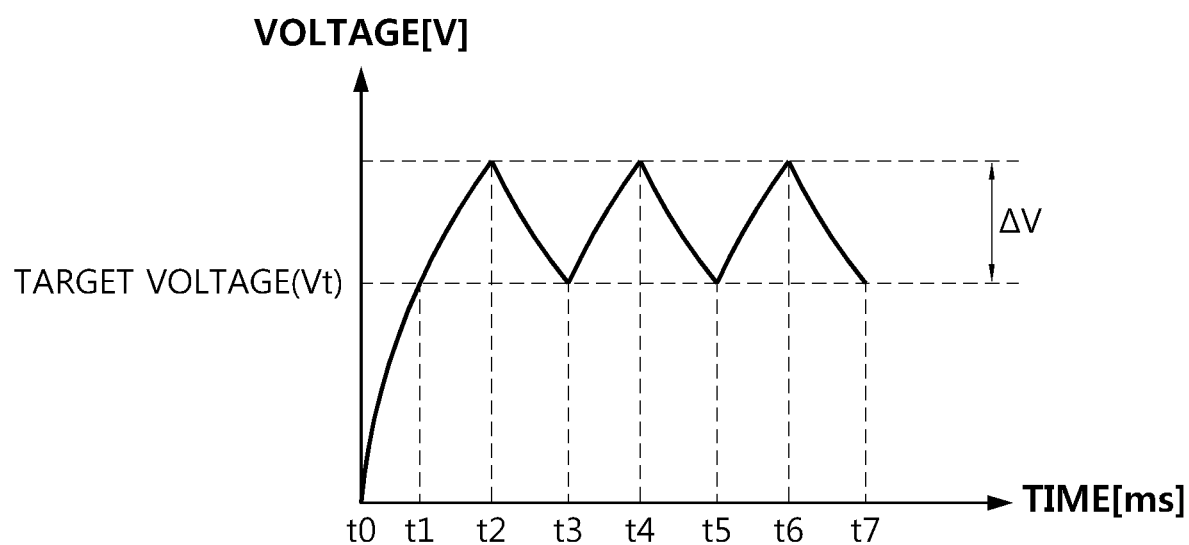
FIG. 5 is a diagram showing an example where a voltage of the capacitor is changed, in the FET controlling apparatus according to an embodiment of the present disclosure.

FIG. 5 is a diagram showing an example where a voltage of the capacitor 110 is changed, in the FET controlling apparatus 100 according to an embodiment of the present disclosure.

Hereinafter, in FIG. 5, it is assumed that the operation states of the first switch SW1, the second switch SW2, the third switch SW3 and the fourth switch SW4 are all turn-on states at the time before t0. In addition, it is assumed that the target voltage (Vt) is set to Vt based on the voltage (Vs) of the source terminal S of the FET 20 and the preset threshold voltage (Vth).

Referring to FIG. 5, charging of the capacitor 110 may start at t0. For example, at t0, the control unit 140 may output a turn-on control signal to the second control line CL2 to convert the operation states of the third switch SW3 and the fourth switch SW4 to a turn-on state.

During t0 to t2, the capacitor 110 may be charged. Here, the control unit 140 may electrically connect the charging line until the voltage of the capacitor 110 becomes equal to or higher than the target voltage (Vt) by a certain voltage (ΔV). That is, at t1, the voltage of the capacitor 110 may reach the target voltage (Vt), but the control unit 140 may electrically connect the charging line until t2, so that the voltage of the capacitor 110 becomes equal to or higher than the target voltage (Vt) by a certain voltage (ΔV).

Here, the certain voltage (ΔV) may be a voltage value set in advance by the control unit 140. For example, the certain voltage (ΔV) may be 0 [V] or higher. Preferably, the certain voltage (ΔV) may be 0.1 [V]. That is, the control unit 140 may electrically connect the charging line so that the voltage of the capacitor 110 becomes equal or higher than the target voltage (Vt) by 0.1 [V].

If the discharging line is electrically connected to discharge the capacitor 110, the voltage of the capacitor 110 decreases. Thus, in order to prevent the operation state of the FET 20 from being unexpectedly converted into a turn-off state, the control unit 140 may electrically connect the charging line until the voltage of the capacitor 110 becomes equal to or higher than the target voltage (Vt) by the certain voltage (ΔV).

In addition, during t2 to t3, the capacitor 110 may be discharged. At t2, the control unit 140 may output a turn-off control signal to the second control line CL2 to convert the operation states of the third switch SW3 and the fourth switch SW4 to a turn-off state, and output a turn-on control signal to the first control line CL1 to convert the operation states of the first switch SW1 and the second switch SW2 to a turn-on state.

As shown in FIG. 5, when the capacitor 110 is charged (t0 to t2), the voltage of the capacitor 110 may increase exponentially, and when the capacitor 110 is discharged (t2 to t3), the voltage of the capacitor 110 may decrease exponentially. Accordingly, the control unit 140 may electrically connect the charging line and the discharging line alternately, so that the voltage of the capacitor 110 is maintained to be equal to or higher than the target voltage (Vt) within a certain voltage range (ΔV) during t1 to t3.

After t3, the control unit 140 may electrically connect the charging line and the discharging line alternately with each other. The control unit 140 may electrically connect the charging line during t3 to t4, electrically connect the discharging line during t4 to t5, electrically connect the charging line during t5 to t6, and electrically connect the discharging line during t6 to t7. Here, when the charging line is electrically connected, the connection of the discharging line may be blocked, and when the discharging line is electrically connected, the connection of the charging line may be blocked.

For example, assuming that the predetermined control cycle is set to 0.5 ms, the control unit 140 may electrically connect the charging line or the discharging line at every 0.5 ms. That is, in the embodiment of FIG. 5, t1, t3, t5 and t7 may be different from each other by 0.5 ms. In addition, in the embodiment of FIG. 5, t2, t4 and t6 may be different from each other by 0.5 ms.

Therefore, the FET controlling apparatus 100 according to an embodiment of the present disclosure may maintain the voltage of the capacitor 110 to be equal to or higher than the target voltage (Vt) by electrically connecting the charging line and the discharging line alternately. In addition, the FET controlling apparatus 100 may maintain the voltage of the capacitor 110 constantly within a certain range, so that the voltage applied to the gate terminal G of the FET 20 is maintained constantly. Therefore, a failure of FET 20 caused by application of overvoltage may be prevented.

Preferably, the predetermined control cycle may be a cycle set so that the voltage of the capacitor 110 is maintained equal to or higher than the target voltage (Vt).

Specifically, the predetermined control cycle may be set to correspond to a time required for the voltage of the capacitor 110 to reach the target voltage (Vt) when the charged capacitor 110 is discharged.

For example, referring to FIG. 5, at t0 to t2, the capacitor 110 may be charged until the voltage becomes equal to or higher than the target voltage (Vt) by the certain voltage (ΔV). In addition, the control unit 140 may calculate in advance the time (t2 to t3) required for the voltage of the capacitor 110 to reach the target voltage (Vt) when the capacitor 110 is discharged, and set the calculated time as the control cycle. Here, the control unit 140 may calculate the control cycle based on a time constant of the capacitor 110 and a magnitude of the certain voltage (ΔV). Here, the time constant of the capacitor 110 is a general term used to calculate the charging time and the discharging time of the capacitor 110, and a detailed description thereof will be omitted.

In addition, the control unit 140 may maintain the voltage of the capacitor 110 equal to or higher than the target voltage (Vt) by electrically connecting the charging line and the discharging line alternately at every predetermined cycle.

For example, in the embodiment of FIG. 5, the control unit 140 may electrically connect the charging line and block the connection of the discharging line at t0, t3, t5 and t7. In addition, the control unit 140 may electrically connect the discharging line and block the connection of the charging line at t2, t4 and t6.

Therefore, the FET controlling apparatus 100 according to an embodiment of the present disclosure has an advantage of applying a voltage within a certain range to the gate terminal G of the FET 20. That is, the FET controlling apparatus 100 may maintain the gate voltage (Vgs) to be equal to or higher than the threshold voltage (Vth), thereby preventing the operation state of the FET 20 from being unexpectedly converted to a turn-off state.

If the voltage (Vs) of the source terminal S is changed, the control unit 140 may be configured to reset the target voltage (Vt) to correspond to the changed voltage (Vs) of the source terminal S.

Figure 6:
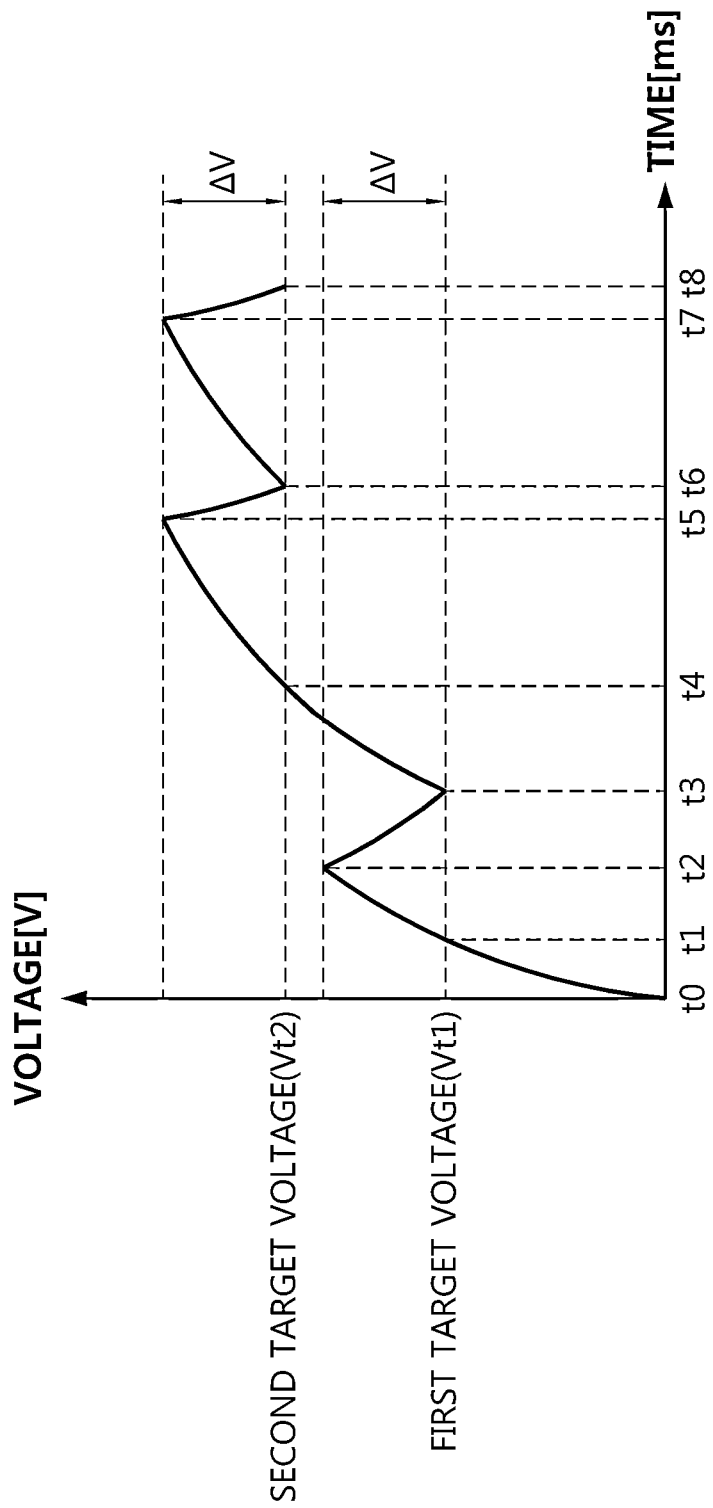
FIG. 6 is a diagram showing another example where the voltage of the capacitor is changed, in the FET controlling apparatus according to an embodiment of the present disclosure.

FIG. 6 is a diagram showing another example where the voltage of the capacitor 110 is changed, in the FET controlling apparatus 100 according to an embodiment of the present disclosure.

FIG. 6 is a diagram showing the change of the voltage of the capacitor 110 when the voltage (Vs) of the source terminal S is changed at t3. Specifically, FIG. 6 is a diagram showing a case in which the voltage (Vs) of the source terminal S at t3 is increased compared to the voltage (Vs) of the source terminal S at t0.

The case where the voltage (Vs) of the source terminal S is increased may correspond to a case where the voltage of the load connected to battery pack 1 is increased, or the case where the magnitude of the resistor connected to the source terminal S of the FET 20 decreases, so that the voltage applied to the source terminal S of the FET 20 is increased. For example, when the operation state of the FET 20 is a turn-off state, the voltage applied to the source terminal S of the FET 20 through the positive electrode terminal P+ of the battery pack 1 may be increased. Hereinafter, a case where the voltage (Vs) of the source terminal S is increased will be described, but the FET controlling apparatus 100 according to an embodiment of the present disclosure may also be applied to a case where the voltage (Vs) of the source terminal S is decreased.

Referring to the embodiment of FIG. 6, the control unit 140 may set a first target voltage (Vt1) corresponding to the voltage (Vs) of the source terminal S at to. In addition, if the voltage (Vs) of the source terminal S is increased at t3, the control unit 140 may set a second target voltage (Vt2) corresponding to the increased voltage (Vs) of the source terminal S. After t3, the control unit 140 may increase the time for electrically connecting the charging line so that the voltage of the capacitor 110 becomes equal to or higher than the set second target voltage (Vt2) by a certain voltage (ΔV).

For example, it is assumed that the threshold voltage (Vth) of the FET 20 is 3 [V], the voltage (Vs) of the source terminal S at t0 is 1 [V], and the voltage (Vs) of the source terminal S after t3 is 2 [V]. The control unit 140 may set the first target voltage (Vt1) at t0 to 4 [V], which is the sum of the threshold voltage (Vth) and the voltage (Vs) of the source terminal S. In addition, the control unit 140 may set the second target voltage (Vt2) at t3 to 5 [V], which is the sum of the threshold voltage (Vth) and the increased voltage (Vs) of the source terminal S. If the target voltage (Vt) is not changed after t3, the gate voltage (Vgs) of the FET 20 may be lower than the threshold voltage (Vth). In this case, the operation state of the FET 20 is unexpectedly switched to a turn-off state, so the control unit 140 may reset the target voltage (Vt) to correspond to the changed voltage (Vs) of the source terminal S.

In addition, the control unit 140 may be configured to change the predetermined control cycle based on the reset target voltage (Vt).

In the embodiment of FIG. 6, after t3, the control unit 140 may charge the capacitor 110 by electrically connecting the charging line until the voltage of the capacitor 110 becomes equal to or higher than the second target voltage (Vt2) by the certain voltage (ΔV). In addition, the control unit 140 may calculate the time taken until the completely charged capacitor 110 reaches the second target voltage (Vt2) in consideration of the time constant of the capacitor 110. The control unit 140 may change the predetermined control cycle to the calculated time. That is, the time t1 to t3 may be a control cycle before change, and the times t4 to t6 and t6 to t8 may be control cycles after change. For example, the control cycle before change may be 0.5 ms, and the control cycle after change may be 0.7 ms.

After t3, the control unit 140 may control the operation state of the FET 20 by electrically connecting the charging line and the discharging line alternately based on the reset second target voltage (Vt2) and the changed control cycle.

Therefore, the FET controlling apparatus 100 according to an embodiment of the present disclosure has an advantage of controlling the operation state of the FET 20 by adaptively changing the voltage applied to the gate terminal G of the FET 20, even if the voltage applied to the source terminal S of the FET 20 is changed.

The measuring unit 130 may be configured to further measure a voltage (Vd) of the drain terminal D.

For example, referring to FIG. 2, the measuring unit 130 may be electrically connected to the drain terminal D of the FET 20 through the first sensing line SL1. In addition, the measuring unit 130 may measure the voltage (Vd) of the drain terminal D through the first sensing line SL1.

The control unit 140 may be configured to receive the voltage (Vd) of the drain terminal D from the measuring unit 130.

The measuring unit 130 may convert the measured voltage (Vd) of the drain terminal D into a digital signal. In addition, the measuring unit 130 may output the converted digital signal to a line connected to the control unit 140. The control unit 140 may receive the digital signal from the measuring unit 130 and obtain the voltage (Vd) of the drain terminal D measured by the measuring unit 130 by reading the received digital signal.

In addition, the control unit 140 may be configured to diagnose whether the FET 20 has a failure by comparing the voltage (Vd) of the drain terminal D and the voltage (Vs) of the source terminal S based on the operation state of the FET 20.

Specifically, the control unit 140 may compare the voltage (Vd) of the drain terminal D and the voltage (Vs) of the source terminal S after electrically connecting the charging line. At this time, if the voltage (Vd) of the drain terminal D and the voltage (Vs) of the source terminal S are the same, the control unit 140 may determine that the operation state of the FET 20 is normally converted to a turn-on state. That is, in this case, the control unit 140 may diagnose that the state of the FET 20 is a normal state. If the voltage (Vd) of the drain terminal D and the voltage (Vs) of the source terminal S are not the same, the control unit 140 may diagnose that the state of the FET 20 is a failure state. In particular, the control unit 140 may diagnose that the state of the FET 20 is a turn-on failure state in which the operation state is not converted to a turn-on state.

Therefore, the FET controlling apparatus 100 according to an embodiment of the present disclosure has an advantage of diagnosing whether the FET 20 has a failure by comparing the voltage (Vd) of the drain terminal D and the voltage (Vs) of the source terminal S of the FET 20.

In addition, the FET controlling apparatus 100 according to the present disclosure may be provided to a battery pack 1. That is, the battery pack 1 according to the present disclosure may include the FET controlling apparatus 100 described above and at least one battery cell 10. In addition, the battery pack 1 may further include electrical equipment (a relay, a fuse, etc.), a case, and the like.

For example, referring to FIG. 2, the battery pack 1 may include the battery cell 10, the FET 20, and the FET controlling apparatus 100. Here, the drain terminal D of the FET 20 may be connected to the positive electrode terminal of the battery cell 10, the source terminal S of the FET 20 may be connected to the positive electrode terminal P+ of the battery pack 1, and the capacitor 110 may be connected between the gate terminal G and the source terminal S of the FET 20.

FIG. 7 is a diagram schematically showing a FET controlling method according to another embodiment of the present disclosure.

The FET controlling method may be performed by the FET controlling apparatus 100 according to an embodiment of the present disclosure.

Referring to FIG. 7, the FET controlling method may include a voltage measuring step (S100), a target voltage setting step (S200), a capacitor charging step (S300), and a FET operation state controlling step (S400).

The voltage measuring step (S100) is a step of measuring the voltage (Vs) of the source terminal S and the voltage of the capacitor 110 connected in parallel to the FET 20, and may be performed by the measuring unit 130.

For example, in the embodiment of FIG. 2, the measuring unit 130 may measure the voltage (Vs) of the source terminal S of FET 20 through the second sensing line SL2. In addition, the measuring unit 130 may measure the voltage of the capacitor 110 through the third sensing line SL3 and the fourth sensing line SL4.

The target voltage setting step (S200) is a step of setting the target voltage (Vt) based on the voltage (Vs) of the source terminal S measured in the voltage measuring step (S100), and may be performed by the control unit 140.

The control unit 140 may set the target voltage (Vt) by summing the voltage (Vs) of the source terminal S measured by the measuring unit 130 and the preset threshold voltage (Vth) of the FET 20.

The capacitor charging step (S300) is a step of charging the capacitor 110 so that the voltage of the capacitor 110 becomes equal to or higher than the target voltage (Vt), and may be performed by the control unit 140.

Specifically, after setting the target voltage (Vt), the control unit 140 may charge the capacitor 110 by controlling the operation states of the third switch SW3 and the fourth switch SW4 disposed on the charging line to a turn-on state.

In addition, the control unit 140 may receive the voltage of the capacitor 110 from the measuring unit 130, and maintain the operation states of the third switch SW3 and the fourth switch SW4 as a turn-on state until the voltage of the capacitor 110 becomes equal to or higher than the target voltage (Vt) by the certain voltage (ΔV).

The FET operation state controlling step (S400) is a step of controlling the operation state of the FET 20 using the capacitor 110 completely charged in the capacitor charging step (S300), and may be performed by the control unit 140.

The control unit 140 may control the operation state of the FET 20 by electrically connecting the charging line and the discharging line alternately. At this time, the control unit 140 may maintain the voltage of the capacitor 110 to be equal to or higher than the target voltage (Vt) by electrically connecting the charging line and the discharging line alternately according to the predetermined control cycle.

In addition, if the voltage applied to the source terminal S is changed while the control unit 140 is controlling the operation state of the FET 20, the control unit 140 may reset the target voltage (Vt) to correspond to the changed voltage (Vs) of the source terminal S, and change the predetermined control cycle based on the reset target voltage (Vt). After that, the control unit 140 may maintain the voltage of the capacitor 110 to be equal to or higher than the reset target voltage (Vt) by electrically connecting the charging line and the discharging line alternately based on the changed control cycle.

The FET controlling apparatus 100 according to the present disclosure may be applied to a BMS (Battery Management System). That is, the BMS according to the present disclosure may include the FET controlling apparatus 100 described above. In this configuration, at least some of the components of the FET controlling apparatus 100 may be implemented by supplementing or adding functions of components included in a conventional BMS. For example, the capacitor 110, the voltage source 120, the measuring unit 130 and the control unit 140 of the FET controlling apparatus 100 may be implemented as components of the BMS.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery cell
20: FET
100: FET controlling apparatus
110: capacitor
120: voltage source
130: measuring unit
140: control unit

What is claimed is:

1. A field-effect transistor (FET) controlling apparatus for controlling an operation state of a FET that includes a drain terminal connected to a battery cell, a gate terminal and a source terminal, the FET controlling apparatus comprising:
   a capacitor configured to be connected in parallel with the FET between the gate terminal and the source terminal through a discharging line;
   a plurality of switches including at least two switches configured to connect the capacitor to the gate terminal and the source terminal;
   a voltage source configured to be electrically connected to the capacitor through a charging line and configured to charge the capacitor in response to the charging line being electrically connected, the voltage source being isolated from the battery cell connected to the drain terminal of the FET and configured to only connect to and form a closed circuit with at least two switches of the plurality of switches to charge the capacitor;
   a measurer configured to measure a voltage of the source terminal and a voltage of the capacitor; and
   a controller configured to receive the voltage of the source terminal and the voltage of the capacitor from the measurer, set a target voltage based on the voltage of the source terminal, charge the capacitor by the voltage source by electrically connecting the charging line until the capacitor is completely charged so that the voltage of the capacitor becomes equal to or higher than the target voltage, and control the operation state of the FET by electrically connecting the discharging line after the capacitor is completely charged,
   wherein the controller is configured to set the target voltage by adding a preset threshold voltage and the voltage of the source terminal, and
   wherein the threshold voltage is set in advance as a voltage difference between the gate terminal and the source terminal, which converts the operation state of the FET to a turn-on state.

2. The FET controlling apparatus according to claim 1, wherein the discharging line is configured to include:
   a first unit line having a first switch of the plurality of switches configured to connect the gate terminal and a first end of the capacitor; and
   a second unit line having a second switch of the plurality of switches configured to connect the source terminal and a second end of the capacitor.

3. The FET controlling apparatus according to claim 2, wherein the charging line includes:
   a third unit line having a third switch of the plurality of switches configured to connect the first end of the capacitor and a positive electrode terminal of the voltage source; and
   a fourth unit line having a fourth switch of the plurality of switches configured to connect the second end of the capacitor and a negative electrode terminal of the voltage source,
   wherein the first end of the capacitor is configured to be connected between the first switch and the third switch, and
   wherein the second end of the capacitor is configured to be connected between the second switch and the fourth switch.

4. The FET controlling apparatus according to claim 3, wherein the controller is configured to control operation states of the first switch and the second switch simultaneously and to control operation states of the third switch and the fourth switch simultaneously.

5. The FET controlling apparatus according to claim 1, wherein the controller is configured to electrically connect any one of the charging line and the discharging line and electrically disconnect the other of the charging line and the discharging line at every predetermined control cycle, after the capacitor is completely charged.

6. The FET controlling apparatus according to claim 5, wherein the predetermined control cycle is a cycle set to maintain the voltage of the capacitor to be equal to or higher than the target voltage.

7. The FET controlling apparatus according to claim 5, wherein in response to the voltage of the source terminal being changed, the controller is configured to reset the target voltage to correspond to a changed voltage of the source terminal and change the predetermined control cycle based on the reset target voltage.

8. The FET controlling apparatus according to claim 1, wherein the measurer is configured to further measure a voltage of the drain terminal, and
   wherein the controller is configured to receive the voltage of the drain terminal from the measurer and diagnose whether the FET has a failure by comparing the voltage of the drain terminal and the voltage of the source terminal based on the operation state of the FET.

9. A battery pack, comprising the FET controlling apparatus according to claim 1.

10. A field-effect transistor (FET) controlling method for controlling an operation state of a FET that includes a drain terminal connected to a battery cell, a gate terminal and a source terminal, the FET controlling method comprising:
    measuring a voltage of the source terminal and a voltage of a capacitor connected in parallel with the FET;
    setting a target voltage based on the voltage of the source terminal measured in the voltage measuring by adding a preset threshold voltage and the voltage of the source terminal;
    charging the capacitor, by a voltage source that is isolated from the battery cell connected to the drain terminal of the FET and that is configured to only connect to and form a closed circuit with at least two switches of a plurality of switches to charge the capacitor, until the capacitor is completely charged so that the voltage of the capacitor becomes equal to or higher than the target voltage; and
    controlling the operation state of the FET by using the capacitor that is completely charged by the charging the capacitor,
    wherein the threshold voltage is set in advance as a voltage difference between the gate terminal and the source terminal, which converts the operation state of the FET to a turn-on state.

* * * * *